Oct. 17, 1967 J. B. ATKINS 3,348,162

CIRCUIT WITH SELECTIVE NONLINEAR FEEDBACK

Filed Feb. 26, 1965

INVENTOR
JAMES B. ATKINS

BY

ATTORNEY

United States Patent Office 3,348,162
Patented Oct. 17, 1967

3,348,162
CIRCUIT WITH SELECTIVE NONLINEAR FEEDBACK

James B. Atkins, Pleasant Valley, N.Y., assignor to International Business Machines Corporation, New York, N.Y., a corporation of New York Filed Feb. 26, 1965, Ser. No. 435,466
9 Claims. (Cl. 330—28)

ABSTRACT OF THE DISCLOSURE

Improvement in a prior art transistor circuit having a diode feedback connection between the output and input to prevent the transistor from being saturated. This disclosure teaches a second diode connection that helps to suppress oscillation that can be caused by the feedback of the saturation preventing diode.

*Background*

Some circuits for high speed applications, logic circuits for example, have diodes that interconnect the collector and base terminals to prevent forward biasing the base-collector junction, a condition called saturation that slows the switching action of the circuit. In a prior art circuit that will be described in detail later, a first transistor is connected as an emitter-follower and a second transistor is connected in a common emitter configuration so that the signal at the output terminal of the second transistor is inverted with respect to the signal at the base terminal of the first transistor. A diode connects the inverted output to the input and at voltage conditions associated with approaching saturation the diode turns on and degenerates the input wave form and thereby prevents saturating the second transistor. The feedback loop formed by the diode may make the circuit oscillate; this effect can be understood in classical feedback theory by recognizing that the small inductance of the interconnections between the two transistors and the diode are significant at very high frequencies (e.g. 100 megacycles). A general object of this invention is to provide a new and improved circuit with negative feedback with means to prevent the circuit from oscillating seriously.

*Summary of the invention*

The circuit of this invention achieves nonoscillatory operation by providing a diode between the collector terminals of the two transistors and by providing a resistor in the collector circuit of the first transistor. The resistor slows the response of the circuit by a phenomenon called the Miller effect; the capacitance between the base and collector terminals appears to have a high value because voltage changes at the collector terminal occur in opposition to voltage changes at the base terminal. The diode responds to the voltages at the two collector terminals to turn on at appropriate points in the oscillatory cycle and limit voltage changes at the first collector terminal and thereby suppress the Miller effect. Thus the resistor and diode cooperate to selectively give the circuit a faster or slower response to oppose oscillation.

The specific description of one embodiment of the circuit will incidentally explain a prior art circuit having an anti-saturation feedback arrangement that may cause oscillation; this more specific background of the prior art will introduce problems in achieving a suitable nonoscillating circuit, and additional objects, features and advantages of the circuit of this invention will be apparent.

Figure 1:
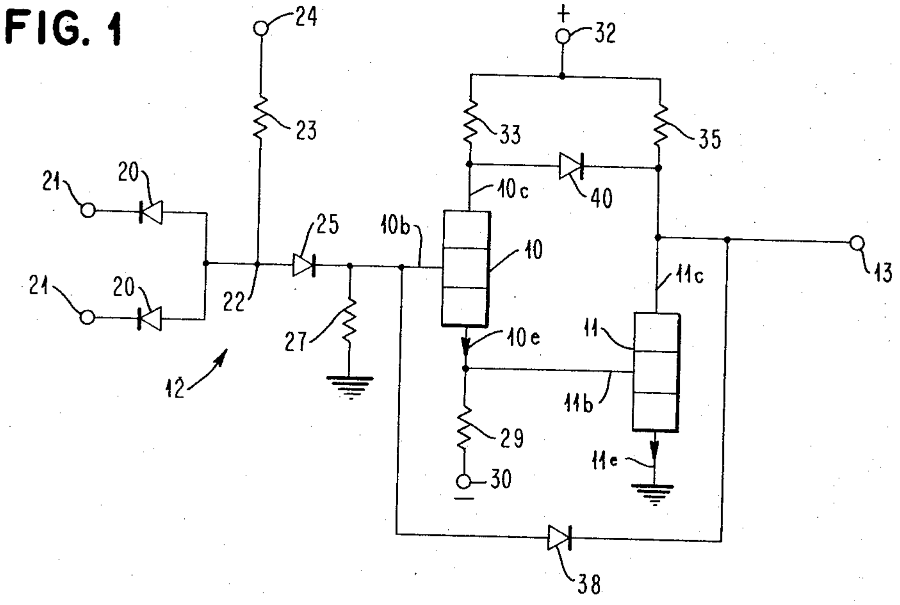
Figure 2:
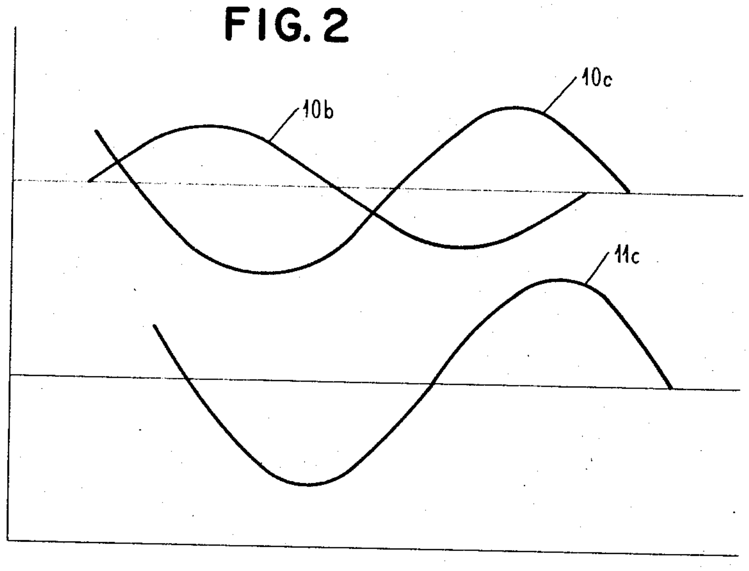

*The drawing.*—FIG. 1 is a schematic of the circuit of this invention. FIG. 2 shows wave forms that will be used to describe the operation of the circuit of FIG. 1.

*The circuit of FIG. 1.*—FIG. 1 shows a circuit of two transistors 10 and 11 that are connected to receive a binary input from a circuit 12 and to produce an inverted output at a circuit output terminal 13. Although the input circuit 12 is not part of the invention, a well known AND circuit is shown in the drawing to help explain the operation of the circuit of this invention. The illustrative input circuit comprises a plurality of diodes 20 connected between individual input terminals 21 and a common connection point 22 and a resistor 23 connected between a potential point 24 and point 22 to form an AND logic function of the inputs. A diode 25 connects point 22 to base terminal **10*b* of transistor 10 to supply base current to transistor 10 in circuit with resistor 23 when each input terminal 21 receives a high level signal. A resistor connects base terminal 10*b* to a point of reference potential, illustrated as ground, to establish a selected voltage at the base terminal when any one of inputs 21 receives a low level signal. Diode 25 isolates the potential of base terminal 10*b* when point 22 has a low voltage level and it provides an OR function with other input circuits that may be connected to base terminal 10*b*. Input circuit 10 illustrates a characteristic of most input circuits; the voltage at base terminal 10*b* falls as the current of resistor 23 in the input circuit is increased. In the circuit that will be described next, base terminal 10*b* is connected to collector terminal 11*c* of transistor 11** to limit the voltage at the base terminal according to the voltage at the collector terminal to prevent saturation.

First transistor 10 is connected as an emitter-follower; its base terminal **10*b* is connected to input circuit 12, a resistor 29 connects emitter terminal 10*e* to a point 30 of appropriate potential, and the collector terminal 10*c* is connected to a second point 32 of appropriate potential. In the specific circuit of the drawing, point 30 is negative with respect to ground; when point 22 in the input circuit is at a low voltage level, transistor 10 conducts at a low level with its emitter terminal 10*e*** slightly negative with respect to ground.

According to this invention a resistor 33 connects collector terminal **10*c* to point 32; resistor 33 transforms the collector current into a proportionate voltage at collector terminal 10*c*. As will be explained later, variations in voltage at collector terminal 10*c* give base terminal 10*b*** an apparent high capacitance.

Second transistor 11 is connected in a conventional common emitter circuit to transform the wave form at emitter terminal **10*e* into an inverted wave form at its collector terminal 11*c*; its emitter is connected to a point of reference potential, ground, its base terminal 11*b* is connected to the emitter terminal 10*e* of transistor 10, and a resistor 35 connects collector terminal 11*c* to a point 32** of appropriate potential.

A diode 38 connects collector terminal **11*c* to base terminal 10*b*; diode 38 is connected to conduct in its forward direction in series with transistor 11** to prevent saturation.

According to this invention, a diode 40 is connected between collector terminals **10*c* and 11*c* in a direction to conduct in series with resistor 33 and the emitter-collector circuit of transistor 11. Resistor 33 and diode 40 provide a selective Miller effect to slow the response of the circuit in part of the oscillatory cycle and to speed up the response in another part of the cycle. The operation of the circuit will be explained in the following sequence: first, a summary explanation of why the circuit would oscillate except for resistor 33 and diode 40**, next, an explanation of the effect of the response of the circuit at various points in the oscillatory cycle, then a review of the Miller effect and an explanation of how this effect is made selective to change the response of the circuit to oppose oscillation.

*Operation.*—FIG. 2 shows oscillatory wave forms that would appear at collector terminals 10*c* and 11*c* and at base terminal 10*b* in a circuit without diode 40 and resistor 33. To simplify and to generalize the explanation, each wave form is illustrated as a pure sinusoid superimposed on an equilibrium level. As FIG. 2 illustrates qualitatively, the voltage at collector terminal 10*c* is inverted with respect to the voltage at base terminal 10*b* and it lags the base voltage somewhat because transistor 10 does not respond instantaneously to the base voltage. The voltage at collector terminal 11*c* is also inverted with respect to the voltage at base terminal 10*b* and the collector voltage lags the base voltage by an amount associated with delays in the circuit of transistors 10 and 11. The voltage at base terminal 10*b* can also be considered to lag the voltage at collector terminal 11*c* by an amount associated with delays in the circuit of diode 38. The circuit will oscillate at some frequency at which the delays that transistors 10 and 11 contribute between base terminal 10*b* and collector terminal 11*c* plus the delay that diode 38 contributes between collector terminal 11*c* and base terminal 10*b* equal a half period. (In addition, the gain around the loop at this frequency must be at least unity.)

When the voltage at point 22 in the input circuit rises, the voltage at base terminal 10*b* rises and the voltage at collector terminal 11*c* falls after delays that have already been described. Because of these delays the voltage at base terminal 10*b* overshoots its equilibrium level and the voltage at collector terminal 11*c* undershoots its equilibrium level before diode 38 turns on and increases its current enough to limit the rise of the voltage at base terminal 10*b*. Because of the undershoot of the voltage at collector terminal 11*c*, diode 38 operates to pull down the voltage at base terminal 10*b* below its equilibrium level. In response to the falling voltage of base terminal 10*b* the voltage at collector terminal 11*c* overshoots its equilibrium level. In circuits without resistor 33 or diode 40, such oscillations persist and destroy the information content of the intended voltage level at output terminal 13.

The contribution of diode 38 to the oscillatory cycle can be summed up as follows. Because diode 38 is slow in turning on, the voltage at base terminal 10*b* overshoots; because the diode is delayed in turning off, the voltage at base terminal 10*b* undershoots. The effect of the delays of diode 38 is aggravated if the voltage at base terminal 10*b* is allowed to rise fast during its overshoot, and the effect associated with turning the diode off late is aggravated if the voltage at base terminal 10*b* falls slowly. To look ahead in the explanation of the circuit of this invention, resistor 33 and diode 40 cooperate to slow the response of the circuit when the voltage at base terminal 10*b* is rising and to speed up the response of the circuit when the voltage at base terminal 10*b* is falling. These components provide this operation by the well known Miller effect which will be summarized next.

A transistor has a rather small capacitance between the base and collector terminals. Resistor 33 produces voltage changes at collector terminal 10*c* that are opposite to voltage changes at base terminal 10*b* by the normal inverter action. This has the effect of increasing the capacitance between the base and collector terminals. One way of understanding this is to consider capacitance as the ratio of charge to voltage; thus when the voltage at the collector terminal changes in opposition to changes at the base terminal, the input circuit 12 must supply more charge to produce the required change in voltage at the base terminal. The variations in collector voltage can be made large with respect to variations at the base voltage according to the values given to resistors 29 and

33 so that the resistor 33 multiplies the base-to-collector capacitance by the gain of the transistor. When diode 40 is not conducting, resistor 33 establishes a high level of capacitance at base terminal 10*b* by the Miller effect. When diode 40 is conducting it limits voltage changes at collector terminal 10*c* and thereby inhibits the Miller effect. As will be explained next, diode 40 is turned on and off to switch base terminal 10*b* from a high capacitance to a low capacitance to appropriately speed up and slow down the response of the circuit to prevent oscillation.

As FIG. 2 illustrates, the maximum voltage between terminals 10*c* and 11*c* occurs in the region of the valleys of the wave form at terminal 11*c*; that is, toward the peak and falling edge of the wave form at base terminal 10*b*. Thus along a significant portion of the rising edge of the voltage wave form at terminal 10*b* resistor 33 provides a Miller effect that slows the response of the circuit and thereby helps to oppose overshoot at the base terminal; along a significant portion of the falling edge of the voltage wave form at base terminal 10, diode 40 suppresses the Miller effect and speeds the response of the circuit to oppose undershoot at terminal 11*c*.

Those skilled in the art will recognize useful variations of the circuit within the scope of the claims. The specific circuit of FIG. 1 will suggest several circuit modifications, and the description of the opertaion of this circuit will suggest how the general features of the invention can be applied to a variety of circuits that may have unwanted oscillations.

What is claimed is:

1. A circuit comprising:

first and second stages of amplifying devices connected to produce at an output terminal of said second stage a signal that is inverted with respect to a signal at an input terminal of said first stage;

circuit means connected between said output terminal and input terminal for negative feedback and tending to produce unwanted oscillations;

means in said first stage providing negative feedback tending to slow the response of the circuit; and means connected to control said negative feedback means of said first stage in response to the voltage level at said output terminal to make said negative feedback selective within the oscillatory cycle to oppose the unwanted oscillation.

2. A circuit according to claim 1 in which said amplifying devices are transistors and said means in said first stage providing negative feedback comprises a resistor connected in the collector circuit of the transistor of said first stage providing a Miller effect.

3. A circuit according to claim 2 in which said means connected to control said negative feedback means of said first stage comprises a semiconductor device connected to control the voltage at the collector terminal of said first stage transistor according to the voltage difference between the collector terminals of the transistors.

4. A circuit comprising:

a first transistor and a second transistor connected to produce a voltage at the collector terminal of the second transistor that is inverted with respect to a signal at the base terminal of said first transistor, and a first diode connecting said collector and base terminals in a direction to prevent saturation of the second transistor and tending to produce unwanted oscillations;

a resistor connected in the collector circuit of the first transistor tending to produce voltage changes at the collector terminal of said first transistor according to changes in conduction in the emitter-collector circuit of said first transistor, and;

a second diode connected for conduction in circuit with said resistor according to the voltage at said second transistor collector terminal to oppose unwanted oscillation.

5. A circuit according to claim 4 in which said second diode is connected to conduct in circuit with the emitter-collector circuit of said second transistor.

6. A circuit according to claim 5 in which said resistor in the collector circuit of said first transistor is given a value tending to reverse bias the base-collector junction of said first transistor.

7. A circuit according to claim 6 in which the base terminal of said second transistor is connected to have the potential of the emitter terminal of said first transistor.

8. A circuit according to claim 7 in which said resistor is given a value to make said second diode conductive when said second transistor is conducting and said circuit is in a nonoscillatory condition.

9. A circuit for suppressing unwanted oscillations in a circuit of the type in which an emitter-follower connected first transistor and a common emitter connected second transistor are connected to produce a signal at the collector terminal of the second transistor that is inverted with respect to a signal at the base terminal of said first transistor and in which a first diode connects said collector and base terminals to prevent saturation of said second transistor, comprising:

a resistor connected in the collector circuit of said first transistor to produce changes in voltage at the collector terminal of said first transistor in opposition to changes in voltage at said base terminal of said first transistor, whereby the response of the circuit is slowed; and a second diode connecting said collector terminal of said first transistor to said collector terminal of said second transistor in a direction to conduct in circuit with said resistor and the emitter-collector circuit of said second transistor.

References Cited

UNITED STATES PATENTS 3,092,729 6/1963 Cray ---------------- 307—88.5

ROY LAKE, *Primary Examiner.*

J. B. MULLINS, *Assistant Examiner.*